(12) United States Patent
Park et al.

(10) Patent No.: US 10,394,070 B2
(45) Date of Patent: Aug. 27, 2019

(54) LIGHT BLOCKING DEVICE, METHOD OF MANUFACTURING THE SAME, AND TRANSPARENT DISPLAY DEVICE INCLUDING THE SAME

(71) Applicant: LG Display Co., Ltd., Seoul (KR)

(72) Inventors: Sunyoung Park, Bucheon-si (KR); Kihan Kim, Paju-si (KR); Choonghyo Kim, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/825,897

(22) Filed: Nov. 29, 2017

(65) Prior Publication Data
US 2018/0149908 A1 May 31, 2018

(30) Foreign Application Priority Data
Nov. 30, 2016 (KR) .......................... 10-2016-0161203

(51) Int. Cl.
| | |
|---|---|
| G02F 1/13 | (2006.01) |
| G02F 1/1335 | (2006.01) |
| G02F 1/1334 | (2006.01) |
| G09G 3/36 | (2006.01) |
| H01L 27/32 | (2006.01) |
| H01L 51/52 | (2006.01) |
| G02F 1/133 | (2006.01) |
| G02F 1/137 | (2006.01) |

(52) U.S. Cl.
CPC ...... *G02F 1/133502* (2013.01); *G02F 1/1334* (2013.01); *G02F 1/13306* (2013.01); *G02F 1/13718* (2013.01); *G02F 1/13737* (2013.01); *G09G 3/3696* (2013.01); *H01L 27/3232* (2013.01); *H01L 51/5281* (2013.01); *G02F 2201/44* (2013.01); *G02F 2202/06* (2013.01); *G02F 2203/01* (2013.01); *G02F 2203/64* (2013.01); *G09G 2310/08* (2013.01); *G09G 2330/021* (2013.01); *H01L 27/3244* (2013.01)

(58) Field of Classification Search
None
See application file for complete search history.

(56) References Cited

U.S. PATENT DOCUMENTS

| | | |
|---|---|---|
| 5,170,271 A | 12/1992 | Lackner et al. |
| 5,559,615 A | 9/1996 | Takei et al. |
| 2006/0145978 A1* | 7/2006 | Takatori ............... G09G 3/2014 345/87 |
| 2007/0268427 A1* | 11/2007 | Uehara ................ G02B 6/0016 349/62 |
| 2012/0256895 A1* | 10/2012 | Azumada ............. G09G 3/3611 345/211 |

(Continued)

*Primary Examiner* — Joseph R Haley
(74) *Attorney, Agent, or Firm* — Polsinelli PC

(57) ABSTRACT

Disclosed are a light blocking device, a method of manufacturing the same, and a transparent display device including the same, which transmit or block light by using a polymer dispersed liquid crystal (PDLC) layer. The light blocking device includes a first substrate and a second substrate facing each other, a first electrode on the first substrate, a second electrode on the second substrate, and a PDLC layer between the first electrode and the second electrode. The PDLC layer includes a droplet including liquid crystals and dichroic dyes, and the liquid crystals and the dichroic dyes are twisted with each other and aligned.

18 Claims, 7 Drawing Sheets

(56) References Cited

U.S. PATENT DOCUMENTS

| | | | |
|---|---|---|---|
| 2014/0160399 A1* | 6/2014 | Yang | G02F 1/1334 349/86 |
| 2014/0232960 A1* | 8/2014 | Schwartz | G02B 26/004 349/12 |
| 2015/0378189 A1 | 12/2015 | Kim et al. | |
| 2015/0378205 A1 | 12/2015 | Kim et al. | |
| 2016/0026026 A1 | 1/2016 | Kim et al. | |

* cited by examiner

LIGHT BLOCKING DEVICE, METHOD OF MANUFACTURING THE SAME, AND TRANSPARENT DISPLAY DEVICE INCLUDING THE SAME

CROSS-REFERENCE TO RELATED APPLICATION

This application claims the benefit of the Korean Patent Application No. 10-2016-0161203 filed on Nov. 30, 2016, which is hereby incorporated by reference in its entirety as if fully set forth herein.

BACKGROUND

Field of the Disclosure

The present disclosure relates to a display device, and more particularly, to a light blocking device, a method of manufacturing the same, and a transparent display device including the same, which realize a light transmitting mode and a light blocking mode.

Description of the Background

Recently, as the advent of the information age, the display field of processing and displaying a massive amount of information is rapidly advancing, and correspondingly, various flat panel display (FPD) devices have been developed and are attracting much attention.

Examples of the FPD devices include LCD devices, plasma display panel (PDP) devices, field emission display (FED) devices, electroluminescence display (ELD) devices, organic light emitting diode (OLED) display devices, etc. The FPD devices have good performances such as thinness, lightness, and low consumption power, and thus, the application fields of the FPD devices are continuously increasing. Particularly, in most electronic devices or mobile devices, the FPD devices are used as a type of user interface.

Moreover, transparent display devices which enable a user to look at a background or an object located behind the transparent display devices are being actively researched recently.

The transparent display devices are advantageous in space availability, interior, and design and may be applied to various fields. The transparent display devices realize an information recognition function, an information processing function, and an information display function by using a transparent electronic device, thereby solving the spatial limitation and visual limitation of electronic devices. For example, a transparent display device may be applied to windows of buildings or vehicles and thus may be implemented as a smart window which allows a background to be seen or displays an image.

Some transparent display devices including an LCD device may be implemented by applying an edge type backlight, but is very low in transmittance. Also, transparent display devices using LCD technology has a problem where transparency is reduced due to a polarizer used for realizing black, and moreover, has inferiority in outdoor visibility.

Furthermore, transparent display devices including an organic light emitting diode (OLED) have high power consumption in comparison with LCD devices and are difficult to realize true black. Also, in the transparent display devices including the OLED, a contrast ratio is not changed in a dark environment but is reduced in a normal environment having light.

In order to realize a light transmitting mode and a light blocking mode, therefore, a method using a polymer dispersed liquid crystal (PLDC) has been proposed for a light blocking device applied to the transparent display devices including the OLED. In a method of producing the PDLC, a liquid crystal is mixed with a monomer, and then, by converting the monomer into a polymer through a ultraviolet (UV) curing, the liquid crystal is converted into a droplet in the polymer, thereby producing the PDLC.

When an electric field is applied to the PDLC, the alignment of the liquid crystal located in the polymer is changed. Therefore, the PDLC may scatter or transmit light incident from the outside. That is, a device using the PDLC can scatter or transmit light even without the polarizer, and thus, may be applied as a light blocking device to the transparent display devices.

SUMMARY

Accordingly, the present disclosure is directed to provide a light blocking device, a method of manufacturing the same, and a transparent display device including the same that substantially obviate one or more problems due to limitations and disadvantages of the related art.

An aspect of the present disclosure is directed to provide a light blocking device, a method of manufacturing the same, and a transparent display device including the same, which by using a PDLC layer where liquid crystals and dichroic dyes are twisted with each other in a droplet, increase a light blocking rate in a light blocking mode and increase a light transmittance in a light transmitting mode.

Another aspect of the present disclosure is directed to provide a light blocking device which over-drives a PDLC layer by reflecting a hysteresis of a light blocking rate and a light transmittance of liquid crystals and dichroic dyes twisted with each other, thereby preventing a driving voltage from increasing and preventing consumption power from increasing.

Another aspect of the present disclosure is directed to provide a light blocking device which controls a twisted angle at which liquid crystals and dichroic dyes are twisted with each other, thereby increasing a light blocking rate in a light blocking mode.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light blocking device including a first substrate and a second substrate facing each other, a first electrode on the first substrate, a second electrode on the second substrate, and a polymer dispersed liquid crystal (PDLC) layer between the first electrode and the second electrode, wherein the PDLC layer comprises a droplet including liquid crystals and dichroic dyes, and the liquid crystals and the dichroic dyes are twisted with each other and aligned.

In another aspect of the present disclosure, there is provided a transparent display device including a transparent display panel including a transmissive area, a non-transmissive area, and a plurality of pixels provided in the non-transmissive area to display an image and a light blocking device on at least one surface of the transparent display panel, wherein the light blocking device comprises a polymer dispersed liquid crystal (PDLC) layer driven in a light blocking mode of blocking incident light or a light transmitting mode of transmitting the incident light, based on a voltage supplied thereto, and the PDLC layer comprises a droplet including liquid crystals and dichroic dyes which are twisted with each other.

In another aspect of the present disclosure, there is provided a method of manufacturing a light blocking device including forming a first electrode on the first substrate, forming a second electrode on the second substrate, forming a liquid crystal material, where liquid crystals, dichroic dyes, and a chiral dopant are mixed with a monomer, on the first electrode, bonding the second electrode to the liquid crystal material, and irradiating ultraviolet (UV) to form a polymer dispersed liquid crystal (PDLC) layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION OF THE DISCLOSURE

Figure 1:
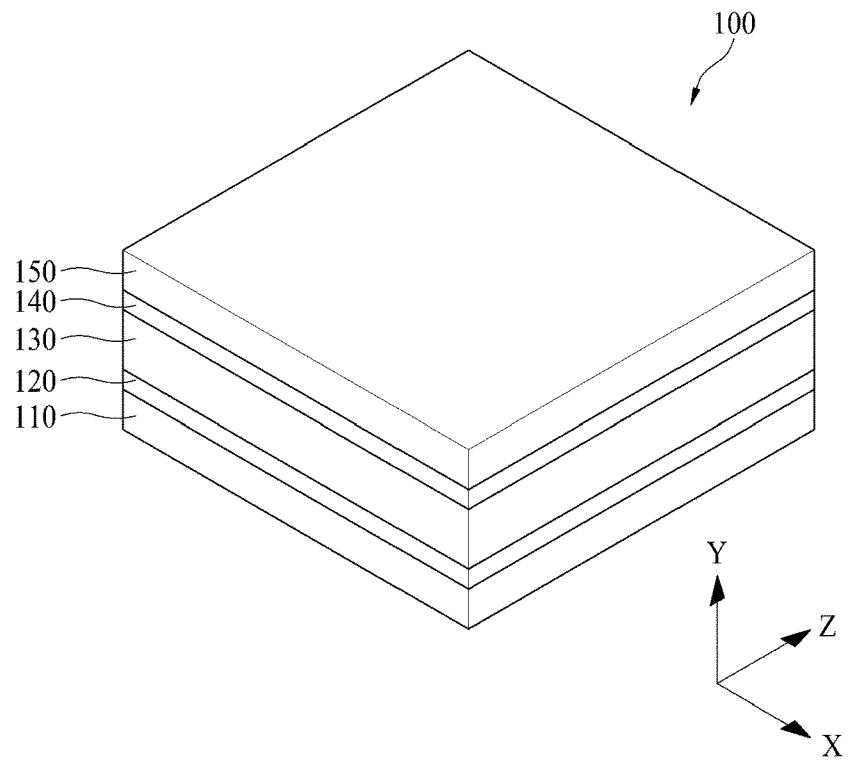
FIG. 1 is a perspective view of a light blocking device according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

FIG. 1 is a perspective view of a light blocking device 100 according to an aspect of the present disclosure.

Figure 2:
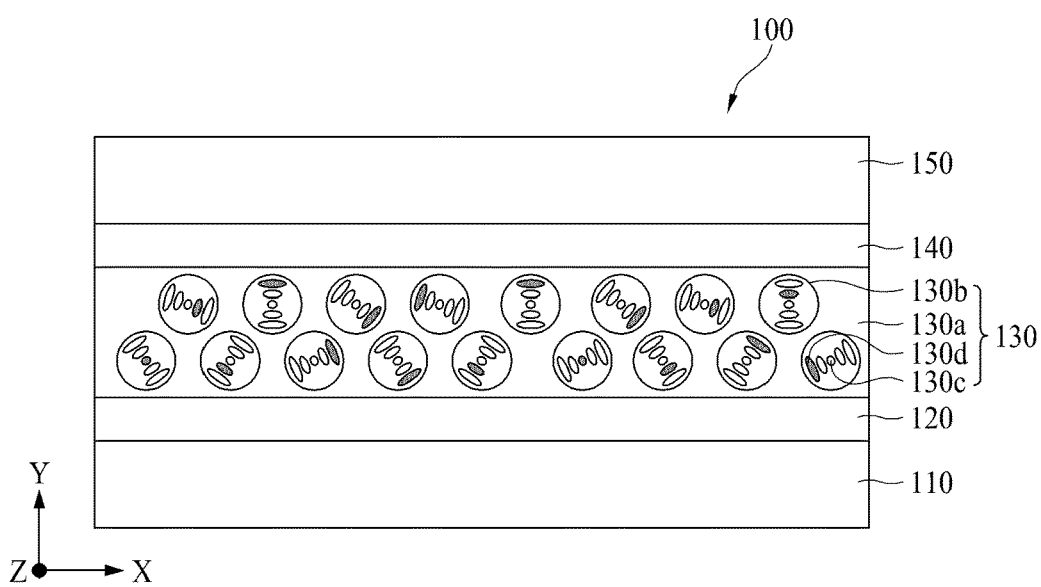
FIG. 2 is a cross-sectional view illustrating in detail an example of the light blocking device of FIG. 1.

FIG. 2 is a cross-sectional view illustrating in detail an example of the light blocking device 100 of FIG. 1.

As illustrated in FIGS. 1 and 2, the light blocking device 100 according to an aspect of the present disclosure may include a first substrate 110, a first electrode 120, a polymer dispersed liquid crystal (PDLC) layer 130, a second electrode 140, and a second substrate 150.

The first and second substrates 110 and 150 may each be a glass substrate, a plastic film, or the like. For example, the first and second substrates 110 and 150 may each be a sheet or a film which includes cellulose resin such as triacetyl cellulose (TAC), diacetyl cellulose (DAC), or the like, cyclo olefin polymer (COP) such as norbornene derivatives or the like, acryl resin such as cyclo olefin copolymer (COC), poly(methylmethacrylate) (PMMA), or the like, polyolefin such as polycarbonate (PC), polyethylene (PE), polypropylene (PP), or the like, polyester such as polyvinyl alcohol (PVA), poly ether sulfone (PES), polyetheretherketone (PEEK), polyetherimide (PEI), polyethylenenaphthalate (PEN), polyethyleneterephthalate (PET), or the like, polyimide (PI), polysulfone (PSF), fluoride resin, and/or the like, but is not limited thereto.

The first electrode 120 may be provided on the first substrate 110, and the second electrode 140 may be provided on the second substrate 150. Each of the first and second electrodes 120 and 140 may be transparent electrode. For example, each of the first and second electrodes 120 and 140 may be formed of silver oxide (for example, AgO, $Ag_2O$, or $Ag_2O_3$), aluminum oxide (for example, $Al_2O_3$), tungsten oxide (for example, $WO_2$, $WO_3$, or $W_2O_3$), magnesium oxide (for example, MgO), molybdenum oxide (for example, $MoO_3$), zinc oxide (for example, ZnO), tin oxide (for example, $SnO_2$), indium oxide (for example, $In_2O_3$), chromium oxide (for example, $CrO_3$ or $Cr_2O_3$), antimony oxide (for example, $Sb_2O_3$ or $Sb_2O_5$), titanium oxide (for example, $TiO_2$), nickel oxide (for example, NiO), copper oxide (for example, CuO or $Cu_2O$), vanadium oxide (for example, $V_2O_3$ or $V_2O_5$), cobalt oxide (for example, CoO), iron oxide (for example, $Fe_2O_3$ or $Fe_3O_4$), niobium oxide (for example, $Nb_2O_5$), ITO, IZO, aluminum doped zinc oxide (ZAO), aluminum tin oxide (TAO), or antimony tin oxide (ATO), but is not limited thereto.

As illustrated in FIG. 2, the PDLC layer 130 may be provided between the first substrate 110 and the second substrate 150, and the PDLC layer 130 may include a polymer 130a and droplets 130b. A PDLC applied to the light blocking device 100 for transparent display devices may scatter incident light according to liquid crystals and polymers which are randomly aligned in an initial state, thereby realizing a light blocking mode. When liquid crystals are vertically aligned according to an applied voltage, the PDLC may transmit incident light as-is without scattering the incident light, thereby realizing a light transmitting mode.

In FIG. 1, only one PDLC layer 130 is illustrated, but the present aspect is not limited thereto. In other aspects, two or more PDLC layers may be provided between the first substrate 110 and the second substrate 150.

The droplets 130b may each include a plurality of liquid crystals 130c. That is, the liquid crystals 130c may be dispersed to the droplets 130b by the polymer 130a. The liquid crystals 130c may be nematic liquid crystals of which alignment is changed by a vertical (a Y axis direction) electric field generated between the first electrode 120 and the second electrode 140, but are not limited thereto.

In order to realize a black-based light blocking mode, the droplets 130b of the PDLC layer 130 may each include a plurality of liquid crystals 130c and dichroic dyes 130d. If the droplets 130b do not include the dichroic dyes 130d, light incident on the PDLC layer 130 may be merely scattered, and thus, a white-based light blocking mode may be realized. In a case where the light blocking device 100 according to an aspect of the present disclosure is applied to a transparent display device, if the transparent display device displays an image, light may be blocked based on black rather than light being blocked based on white, for increasing the quality of an image which is displayed by the transparent display device and is watched by a user. Therefore, in a case where the light blocking device 100 according to an aspect of the present disclosure is applied to a transparent display device, the droplets 130b may each include the dichroic dyes 130d, for increasing a light blocking effect and the image quality of the transparent display device.

The liquid crystals 130c and the dichroic dyes 130d may be dispersed to the droplets 130b by the polymer 130a. The light blocking device 100 according to an aspect of the present disclosure may realize a black state of the light blocking mode according to light being absorbed by the dichroic dyes 130d. That is, the light blocking device 100 may realize a light blocking state according to light being scattered by the PDLC layer 130 and absorbed by the dichroic dyes 130d.

The liquid crystals 130c may be nematic liquid crystals aligned by the vertical electric field generated between the first electrode 120 and the second electrode 140, but are not limited thereto. The alignment of the dichroic dyes 130d, like the liquid crystals 130c, may be changed by the vertical electric field generated between the first electrode 120 and the second electrode 140.

The dichroic dyes 130d may be dyes that absorb light. For example, the dichroic dyes 130d may be black dyes, which absorbs all of light having a visible light wavelength range, or dyes which absorb light outside a wavelength range of a specific color (for example, red) and reflect light having the wavelength range of the specific color (for example, red). In an aspect of the present disclosure, the dichroic dyes 130d may use black dyes so as to increase a light blocking effect of blocking light, but are not limited thereto.

Particularly, the droplets 130b of the PDLC layer 130 according to an aspect of the present disclosure may be provided in order for the liquid crystals 130c and the dichroic dyes 130d to be twisted with each other. That is, the liquid crystals 130c and the dichroic dyes 130d included in each of the droplets 130b of the PDLC layer 130 according to an aspect of the present disclosure may be aligned so as to be twisted with each other without being aligned in an arbitrary random direction. To this end, the PDLC layer 130 according to an aspect of the present disclosure may further include a chiral dopant which induces a twist structure of the liquid crystals 130c and the dichroic dyes 130d.

In a case where the liquid crystals 130c and the dichroic dyes 130d of each of the droplets 130b are aligned in an arbitrary direction, although it is unable to scatter or absorb incident light, liquid crystals 130c and dichroic dyes 130d included in different droplets 130b may be aligned in the same direction, or liquid crystals 130c and dichroic dyes 130d included in the same droplet 130b may be aligned in the same direction, with respect to all droplets 130b included in the PDLC layer 130. In this case, a scattering rate or an absorption rate of light incident on the PDLC layer 130 is lowered. Also, if a content of the dichroic dyes 130d increases for increasing a scattering rate or an absorption rate of incident light, a light transmittance is reduced in the light transmitting mode of the light blocking device 100.

Therefore, in an aspect of the present disclosure, since the liquid crystals 130c and the dichroic dyes 130d are aligned so as to be twisted with each other in each of the droplets 130b, a scattering rate or an absorption rate of incident light increases. A more detailed feature of the droplets 130b according to an aspect of the present disclosure will be described below.

Figure 3:
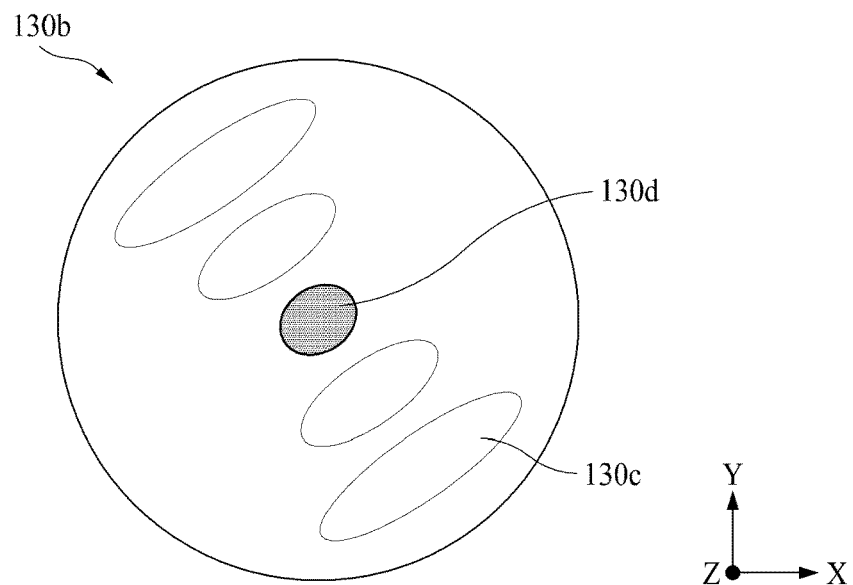
FIG. 3 is an exemplary diagram illustrating a droplet of a polymer dispersed liquid crystal (PDLC) layer.

FIG. 3 is an exemplary diagram illustrating a droplet of a PDLC layer.

As illustrated in FIG. 3, the inside of a droplet 130b may be in a liquid state, and the outside of the droplet 130b may be in a solid state due to a polymer 130a.

Portions of the PDLC layer 130 except for the droplets 130b may be in a solid state due to the polymer 130a. Therefore, the PDLC layer 130 may be provided in plurality, and each of the PDLC layers 130 may maintain a cell gap between the first substrate 110 and the second substrate 150 even without a spacer or a partition wall. Accordingly, in an aspect of the present disclosure, a manufacturing process is simplified, and the manufacturing cost is reduced.

As described above, in the light blocking device 100 according to an aspect of the present disclosure, the liquid crystals 130c and the dichroic dyes 130d may be twisted with each other and aligned. In detail, the liquid crystals 130c and the dichroic dyes 130d may be twisted at a predetermined reference angle and aligned by the chiral dopant in each of the droplets 130b.

Particularly, the liquid crystals 130c and the dichroic dyes 130d according to an aspect of the present disclosure may be twisted with each other at the reference angle (for example, an angle of 360 degrees to 3,600 degrees) and aligned in each of the droplets 130b An angle at which the liquid crystals 130c and the dichroic dyes 130d are twisted with each other may be adjusted based on the amount of chiral dopants included in the PDLC layer 130. In detail, by increasing the amount of chiral dopants, the angle at which the liquid crystals 130c and the dichroic dyes 130d are twisted with each other may increase.

Moreover, a helical twisted power (HTP) which induces the twist structure of the liquid crystals 130c and the dichroic dyes 130d may be changed depending on the kind of a chiral dopant, and thus, the amount of chiral dopants necessary for twisting the liquid crystals 130c and the dichroic dyes 130d at the same angle may be changed depending on the kinds of the chiral dopants.

For example, the amount of chiral dopants which is to be added into the PDLC layer 130 of the light blocking device 100 according to an aspect of the present disclosure may be set based on the following Equation (1):

$$\text{Chiral dopant}[g] = \frac{\text{liquid crystal}[g]}{(\text{pitch}[m] \times HTP[\%\ \mu m]^{-1})[\%] - 1} \quad (1)$$

where pitch denotes a value obtained through an arithmetic operation based on a depth/pitch, depth denotes a size of each of the droplets 130b or a size of the cell gap between the second substrate 120 and the first substrate 110 including the PDLC layer 130, and pitch denotes an interval between the liquid crystals 130c and the dichroic dyes 130d twisted at 360 degrees. That is, depth/pitch denotes the number of times the liquid crystals 130c and the dichroic dyes 130d are fully twisted at 360 degrees in the cell gap or each of the droplets 130b.

Therefore, in the light blocking device 100 according to an aspect of the present disclosure, the PDLC layer 130 may include chiral dopants equal to an amount determined as a value inversely proportional to an HTP value of a chiral dopant and a pitch, and thus, the liquid crystals 130c and the dichroic dyes 130d may be twisted at the reference angle.

In this manner, the PDLC layer 130 according to an aspect of the present disclosure may include the liquid crystals 130c and the dichroic dyes 130d which are twisted with each other and aligned in each of the droplets 130b, and moreover, the liquid crystals 130c and the dichroic dyes 130d may be twisted at an angle of 360 degrees to 3,600 degrees and aligned. Hereinafter, detailed features of the PDLC layer 130 according to an aspect of the present disclosure will be described.

The following Table 1 shows experiment data obtained by comparing transmittances and hazes in a light blocking mode and a light transmitting mode of a light blocking device including a PDLC layer having a structure where liquid crystals and dichroic dyes are not twisted, a light blocking device including a PDLC layer having a structure where liquid crystals and dichroic dyes are twisted with respect to a cell gap, and a light blocking device including a PDLC layer having a structure where liquid crystals and dichroic dyes are twisted with respect to a droplet.

TABLE 1

|  | Twisted angle | Depth/ pitch | Characteristic | Light blocking mode | Light transmitting mode |
|---|---|---|---|---|---|
|  | 0° | ∞ | Transmittance (%) | 54.8 | 70.1 |
|  |  |  | Haze (%) | 85.4 | 6.7 |
| With respect to cell gap | 360° | 1 | Transmittance (%) | 52.7 | 67.4 |
|  |  |  | Haze (%) | 85.8 | 8.4 |
|  | 720° | 2 | Transmittance (%) | 54.0 | 69.6 |
|  |  |  | Haze (%) | 88.1 | 6.4 |
| With respect to droplet (2 μM) | 360° | 1 | Transmittance (%) | 50.2 | 68.8 |
|  |  |  | Haze (%) | 92.5 | 8.5 |
|  | 720° | 2 | Transmittance (%) | 49.2 | 68.2 |
|  |  |  | Haze (%) | 92.7 | 9.3 |

In Table 1, the twisted angle being 0 degrees denotes that the liquid crystals 130c and the dichroic dyes 130d of the PDLC layer 130 are not twisted as in an aspect of the present disclosure, the twisted angle being provided with respect to the cell gap denotes that the liquid crystals 130c and the dichroic dyes 130d of the PDLC layer 130 are twisted with respect to the cell gap between the first substrate 110 and the second substrate 150, and the twisted angle being provided with respect to the droplet denotes that the liquid crystals 130c and the dichroic dyes 130d of the PDLC layer 130 are twisted in each of the droplets 130b.

As shown in Table 1, in comparison with a structure where the liquid crystals and the dichroic dyes are not twisted, it can be confirmed that a transmittance or a haze is not largely changed in the light blocking mode. That is, in a case the liquid crystals and the dichroic dyes are twisted with respect to the cell gap, the liquid crystals and the dichroic dyes are not fully twisted in the droplet, and thus, it is confirmed that as in Table 1, a light blocking rate is not largely affected in the light blocking mode.

However, as in the light blocking device 100 according to an aspect of the present disclosure, in a case where the liquid crystals 130c and the dichroic dyes 130d are twisted at a certain angle in each of the droplets 130b with respect to a corresponding droplet 130b, it is confirmed that in the light blocking mode, a transmittance is reduced and a haze increases.

In detail, when the liquid crystals 130c and the dichroic dyes 130d are twisted at an angle of 360 degrees in each of the droplets 130b, it is confirmed that in the light blocking mode, a transmittance is lowered from 54.8% to 50.2%, and a haze increases from 85.4% to 92.5%, thereby improving a light blocking rate. Also, when the liquid crystals 130c and the dichroic dyes 130d are twisted at an angle of 720 degrees in each of the droplets 130b, it can be confirmed that in the light blocking mode, a transmittance is lowered from 54.8% to 49.2%, and a haze increases from 85.4% to 92.7%, thereby improving a light blocking rate.

As in the light blocking device 100 according to an aspect of the present disclosure, when the liquid crystals 130c and the dichroic dyes 130d are twisted at a certain angle in each of the droplets 130b, it can be confirmed that as shown in Table 1, a light blocking rate is improved, and in the light transmitting mode, a change in transmittance or haze is not large.

Therefore, in the light blocking device 100 according to an aspect of the present disclosure, due to a structure where the liquid crystals 130c and the dichroic dyes 130d are twisted in each of the droplets 130b, a light transmittance is not affected in the light transmitting mode, and a light blocking rate is improved in the light blocking mode.

Moreover, the liquid crystals 130c and the dichroic dyes 130d of the PDLC layer 130 according to an aspect of the present disclosure are twisted at an angle of 360 degrees to 3,600 degrees and aligned in each of the droplets 130b.

More specifically, in an aspect of the present disclosure, the liquid crystals 130c and the dichroic dyes 130d are twisted at least once and aligned in each of the droplets 130b so as to improve a light blocking rate in the light blocking mode. That is, as described above, when the liquid crystals and the dichroic dyes are twisted with respect to the cell gap, the liquid crystals and the dichroic dyes are not twisted at an angle of 360 degrees in the droplet, and for this reason, a light blocking rate is not improved.

Therefore, in an aspect of the present disclosure, the PDLC layer 130 may be implemented so that the liquid crystals 130c and the dichroic dyes 130d are twisted at an angle of 360 degrees or more in each of the droplets 130b, thereby improving a light blocking rate of the light blocking device 100.

Moreover, in an aspect of the present disclosure, the liquid crystals 130c and the dichroic dyes 130d may be twisted at an angle of 3,600 degrees or less in each of the droplets 130b. That is, if an angle at which the liquid crystals 130c and the dichroic dyes 130d are twisted increases infinitely, due to the twist structure of the liquid crystals 130c and the dichroic dyes 130d, visible light is reflected, and a color is shown.

Therefore, in an aspect of the present disclosure, the PDLC layer 130 may be implemented so that the liquid crystals 130c and the dichroic dyes 130d are twisted at an angle of 3,600 degrees or less in each of the droplets 130b, thereby solving a problem where visible light is reflected in the light blocking device 100.

The light blocking device 100 according to an aspect of the present disclosure may control a voltage applied to the first electrode 120 and the second electrode 140, and thus, may realize the light blocking mode of blocking light or the light transmitting mode of transmitting the light. Hereinafter, the light blocking mode and the light transmitting mode of the light blocking device 100 will be described in detail with reference to FIGS. 4 and 5.

Figure 4:
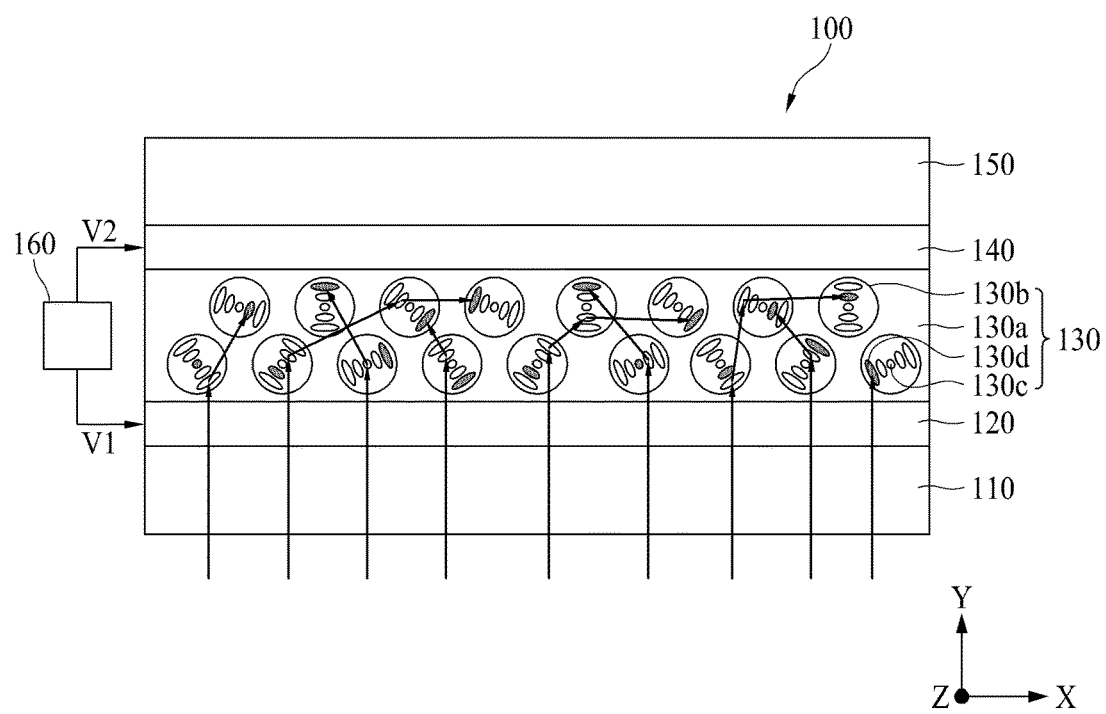
FIG. 4 is a cross-sectional view illustrating an example of a light blocking device in a light blocking mode.
Figure 5:
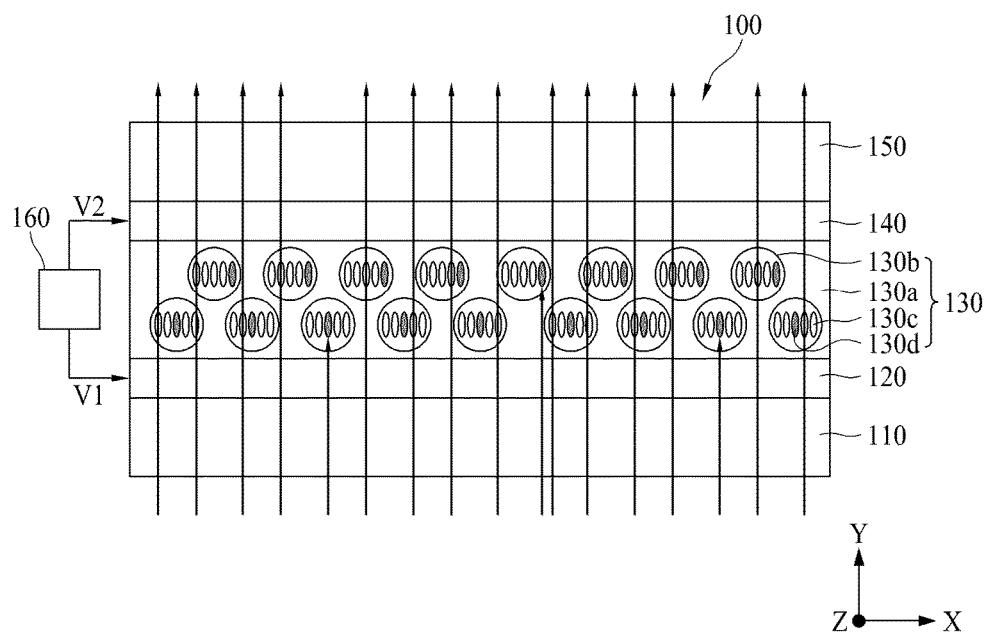
FIG. 5 is a cross-sectional view illustrating an example of a light blocking device in a light transmitting mode.

FIG. 4 is a cross-sectional view illustrating an example of a light blocking device in a light blocking mode, and FIG. 5 is a cross-sectional view illustrating an example of a light blocking device in a light transmitting mode.

As in FIGS. 4 and 5, the light blocking device 100 may further include a voltage supply unit 160 that supplies a certain voltage to each of the first electrode 120 and the second electrode 140. The light blocking device 100 according to an aspect of the present disclosure may control alignment of the liquid crystals 130c and the dichroic dyes 130d of the PDLC layer 130 according to a voltage applied to the first electrode 120 and a voltage applied to the second electrode 140, thereby realizing the light blocking mode of blocking incident light or the light transmitting mode of transmitting the incident light.

As illustrated in FIG. 4, when a voltage is not applied to the first electrode 120 and the second electrode 140 or a voltage difference between a voltage V1 applied to the first electrode 120 and a voltage V2 applied to the second electrode 140 is less than a first threshold value, the liquid crystals 130c and the dichroic dyes 130d of the PDLC layer 130 may maintain a state of being twisted at a certain angle, thereby realizing the light blocking mode of the light blocking device 100. The first threshold value may be set to a voltage difference between the voltage applied to the first electrode 120 and the voltage applied to the second electrode 140 so that a viewer discerns a transmission of light due to alignment of the liquid crystals 130c and the dichroic dyes 130d.

In this case, light incident on the PDLC layer 130 may be scattered by the liquid crystals 130c. The light scattered by the liquid crystals 130c may be absorbed by the dichroic dyes 130d. Therefore, the light blocking device 100 may realize the light blocking mode of blocking incident light. For example, if the dichroic dyes 130d are black dyes, the light blocking device 100 may display a block-based color in the light blocking mode to block incident light. That is, in an aspect of the present disclosure, a specific color may be displayed based on the dichroic dyes 130d, and thus, a rear scene of the light blocking device is not shown.

As described above, the light blocking device 100 according to an aspect of the present disclosure may include a plurality of PDLC layers. In this case, incident light may be scattered by a first PDLC layer. Therefore, a light path for the scattered light may extend, and the scattered light having the extended light path may be incident on a PDLC layer subsequent thereto. The scattered light incident on the subsequent PDLC layer may be scattered by liquid crystals or may be absorbed by dichroic dyes. Accordingly, if the light blocking device 100 according to an aspect of the present disclosure includes the plurality of PDLC layers, a light blocking effect more increases than a case where light is blocked by one PDLC layer.

FIG. 5 is a cross-sectional view illustrating an example of a light blocking device in a light transmitting mode.

As illustrated in FIG. 5, when the voltage difference between the voltage V1 applied to the first electrode 120 and the voltage V2 applied to the second electrode 140 is greater than a second threshold value, the liquid crystals 130c and the dichroic dyes 130d of the PDLC layer 130 may be aligned in a vertical direction (a Y axis direction) by a vertical electric field generated between the first electrode 120 and the second electrode 140, and thus, may transmit incident light as-is. In this case, the second threshold value may be a value which is equal to or greater than the first threshold value.

In this case, the liquid crystals 130c and the dichroic dyes 130d may be aligned in a direction in which light is incident, and a refractive index between the liquid crystals 130c and the polymer 130a of the PDLC layer 130 may be minimized, whereby the scattering and absorbing of the light incident on the PDLC layer 130 are minimized. Accordingly, most of light incident on the light blocking device 100 may pass through the PDLC layer 130 as-is.

As described above with reference to FIGS. 4 and 5, in an aspect of the present disclosure, the PDLC layer 130 including the liquid crystals 130c and the dichroic dyes 130d may transmit light in the light transmitting mode may scatter and absorb the light in the light blocking mode, and thus, the light blocking device 100 may transmit the light in the light transmitting mode and may block the light in the light blocking mode.

Figure 6A:
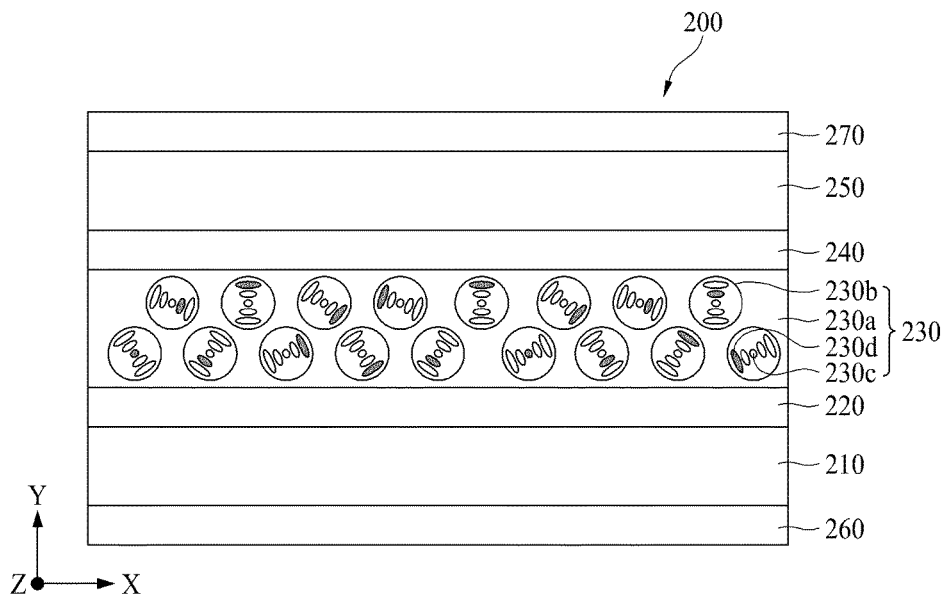
FIGS. 6A to 6C are cross-sectional views illustrating in detail other examples of the light blocking device of FIG. 1.

FIG. 6A is a cross-sectional view illustrating in detail another example of the light blocking device of FIG. 1.

As illustrated in FIG. 6A, a light blocking device 200 according to another aspect of the present disclosure may include a first substrate 210, a first electrode 220, a PDLC layer 230, a second electrode 240, a second substrate 250, a first refractive index correction layer 260, and a second refractive index correction layer 270.

The first substrate 210, the first electrode 220, the PDLC layer 230, the second electrode 240, and the second substrate 250 of FIG. 6A are substantially the same as the first substrate 110, the first electrode 120, the PDLC layer 130, the second electrode 140, and the second substrate 150 of FIGS. 1 and 2. Thus, detailed descriptions of the first substrate 210, the first electrode 220, the PDLC layer 230, the second electrode 240, and the second substrate 250 of FIG. 6A are omitted.

The first refractive index correction layer 260 may be provided on a surface opposite to one surface of the first substrate 210 on which the first electrode 220 is provided. That is, the first electrode 220 may be provided on the one surface of the first substrate 210, and the first refractive index correction layer 260 may be provided on another surface corresponding to the surface opposite to the one surface of the first substrate 210.

The reason that the light blocking device 200 according to another aspect of the present disclosure includes the first refractive index correction layer 260 is as follows. Fresnel reflection occurs due to a refractive index difference between air and the first substrate 210. For example, if there is the refractive index difference between the air and the first substrate 210, light incident on the first substrate 210 through the air may be reflected due to the refractive index difference between the air and the first substrate 210. Therefore, the first refractive index correction layer 260 may have a refractive index between the air and the first substrate 210 for decreasing the refractive index difference between the air and the first substrate 210. For example, if a refractive index of the air is 1 and a refractive index of the first substrate 210 is 1.6, the first refractive index correction layer 260 may have a refractive index of 1.1 to 1.5 for decreasing the refractive index difference between the air and the first substrate 210.

The second refractive index correction layer 270 may be provided on a surface opposite to one surface of the second substrate 250 on which the second electrode 250 is provided. That is, the second electrode 250 may be provided on the one surface of the second substrate 250, and the second refractive index correction layer 270 may be provided on another surface corresponding to the surface opposite to the one surface of the second substrate 250.

The reason that the light blocking device 200 according to another aspect of the present disclosure includes the second refractive index correction layer 270 is as follows. Fresnel reflection occurs due to a refractive index difference between air and the second substrate 270. For example, in a case where there is the refractive index difference between the air and the second substrate 250, some of light passing through the second substrate 250 may be reflected due to a refractive index difference when the light is incident on the air. Therefore, the second refractive index correction layer 270 may have a refractive index between the air and the second substrate 250 for decreasing the refractive index difference between the air and the second substrate 250. For example, if a refractive index of the air is 1 and a refractive index of the second substrate 250 is 1.6, the second refractive index correction layer 270 may have a refractive index of 1.1 to 1.5 for decreasing the refractive index difference between the air and the second substrate 250.

Each of the first and second refractive index correction layers 260 and 270 may be formed of a transparent adhesive film such as an optically clear adhesive (OCA), an organic compound adhesive capable of thermal curing or ultraviolet (UV) curing, and/or the like.

Figure 6B:
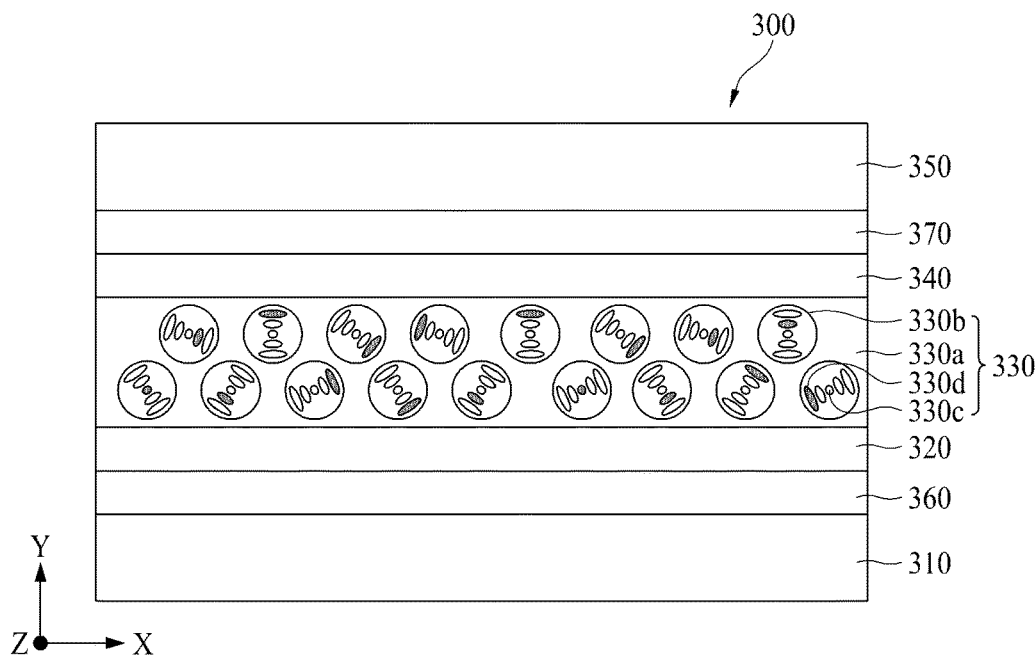

FIG. 6B is a cross-sectional view illustrating in detail another example of the light blocking device of FIG. 1.

As illustrated in FIG. 6B, a light blocking device 300 according to another aspect of the present disclosure may include a first substrate 310, a first electrode 320, a PDLC layer 330, a second electrode 340, a second substrate 350, a first refractive index correction layer 360, and a second refractive index correction layer 370.

The first substrate 310, the first electrode 320, the PDLC layer 330, the second electrode 340, and the second substrate 350 of FIG. 6B are substantially the same as the first substrate 110, the first electrode 120, the PDLC layer 130, the second electrode 140, and the second substrate 150 of FIGS. 1 and 2. Thus, detailed descriptions of the first substrate 310, the first electrode 320, the PDLC layer 330, the second electrode 340, and the second substrate 350 of FIG. 6B are omitted.

The first refractive index correction layer 360 may be provided between the first substrate 310 and the first electrode 320. The reason that the light blocking device 300 according to another aspect of the present disclosure includes the first refractive index correction layer 360 is as follows. Fresnel reflection occurs due to a refractive index difference between the first substrate 310 and the first electrode 320. For example, in a case where there is the refractive index difference between the first substrate 310 and the first electrode 320, some of light passing through the first substrate 310 may be reflected due to a refractive index difference when the light is incident on the first electrode 320. Therefore, the first refractive index correction layer 360 may have a refractive index between the first substrate 310 and the first electrode 320 for decreasing the refractive index difference between the first substrate 310 and the first electrode 320. For example, if a refractive index of the first substrate 310 is 1.6 and a refractive index of the first electrode 320 is 2, the first refractive index correction layer 360 may have a refractive index of 1.7 to 1.9 for decreasing the refractive index difference between the first substrate 310 and the first electrode 320.

The second refractive index correction layer 370 may be provided between the second substrate 350 and the second electrode 340. The reason that the light blocking device 300 according to another aspect of the present disclosure includes the second refractive index correction layer 370 is as follows. Fresnel reflection occurs due to a refractive index difference between the second substrate 350 and the second electrode 340. For example, in a case where there is the refractive index difference between the second substrate 350 and the second electrode 340, some of light passing through the second electrode 340 may be reflected due to a refractive index difference when the light is incident on the second substrate 350. Therefore, the second refractive index correction layer 370 may have a refractive index between the second substrate 350 and the second electrode 340 for decreasing the refractive index difference between the second substrate 350 and the second electrode 340. For example, if a refractive index of the second substrate 350 is 1.6 and a refractive index of the second electrode 340 is 2, the second refractive index correction layer 370 may have a refractive index of 1.7 to 1.9 for decreasing the refractive index difference between the second substrate 350 and the second electrode 340.

Each of the first and second refractive index correction layers 360 and 370 may be formed of a transparent adhesive film such as an OCA, an organic compound adhesive capable of thermal curing or UV curing, and/or the like.

Figure 6C:
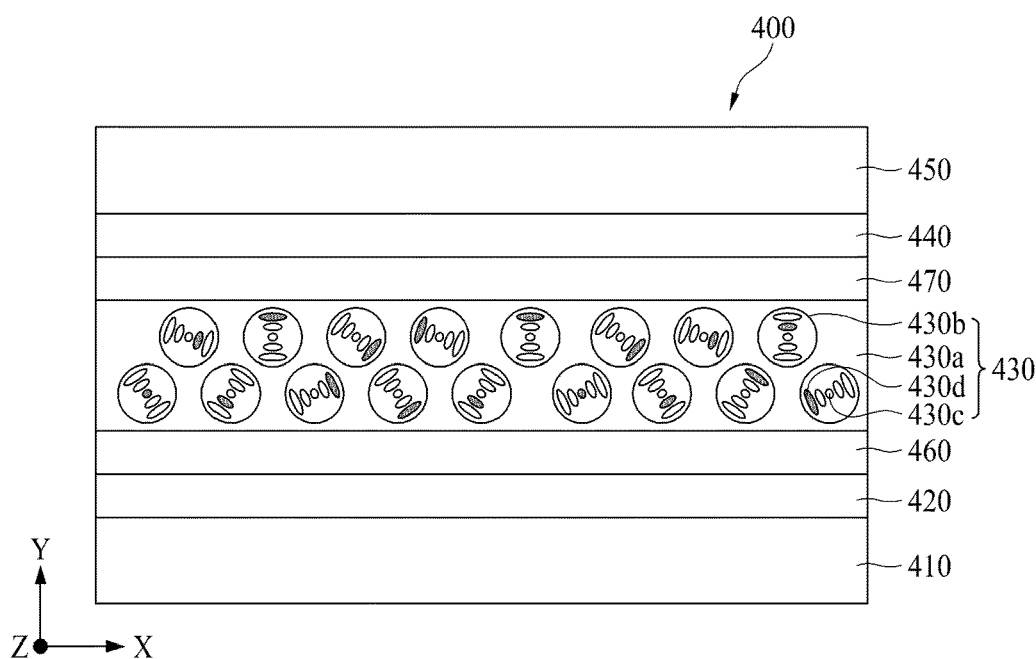

FIG. 6C is a cross-sectional view illustrating in detail another example of the light blocking device of FIG. 1.

As illustrated in FIG. 6C, a light blocking device 400 according to another aspect of the present disclosure may include a first substrate 410, a first electrode 420, a PDLC layer 430, a second electrode 440, a second substrate 450, a first refractive index correction layer 460, and a second refractive index correction layer 470.

The first substrate 410, the first electrode 420, the PDLC layer 430, the second electrode 440, and the second substrate 450 of FIG. 6C are substantially the same as the first substrate 110, the first electrode 120, the PDLC layer 130, the second electrode 140, and the second substrate 150 of FIGS. 1 and 2. Thus, detailed descriptions of the first substrate 410, the first electrode 420, the PDLC layer 430, the second electrode 440, and the second substrate 450 of FIG. 6C are omitted.

The first refractive index correction layer 460 may be provided between the first electrode 420 and the PDLC layer 430. The reason that the light blocking device 400 according to another aspect of the present disclosure includes the first refractive index correction layer 460 is as follows. Fresnel reflection occurs due to a refractive index difference between the first electrode 420 and the PDLC layer 430. For example, in a case where there is the refractive index difference between the first electrode 420 and the PDLC layer 430, some of light passing through the first electrode 420 may be reflected due to a refractive index difference when the light is incident on the PDLC layer 430. Therefore, the first refractive index correction layer 460 may have a refractive index between the first electrode 420 and the PDLC layer 430 for decreasing the refractive index difference between the first electrode 420 and the PDLC layer 430.

The second refractive index correction layer 470 may be provided between the second electrode 440 and the PDLC layer 430. The reason that the light blocking device 400 according to another aspect of the present disclosure includes the second refractive index correction layer 470 is as follows. Fresnel reflection occurs due to a refractive index difference between the second electrode 440 and the PDLC layer 430. For example, in a case where there is the refractive index difference between the second electrode 440 and the PDLC layer 430, some of light passing through the second electrode 440 may be reflected due to a refractive index difference when the light is incident on the PDLC layer 430. Therefore, the second refractive index correction layer 470 may have a refractive index between the second electrode 440 and the PDLC layer 430 for decreasing the refractive index difference between the second electrode 440 and the PDLC layer 430.

Each of the first and second refractive index correction layers 460 and 470 may be formed of a transparent adhesive film such as an OCA, an organic compound adhesive capable of thermal curing or UV curing, and/or the like.

Figure 7A:
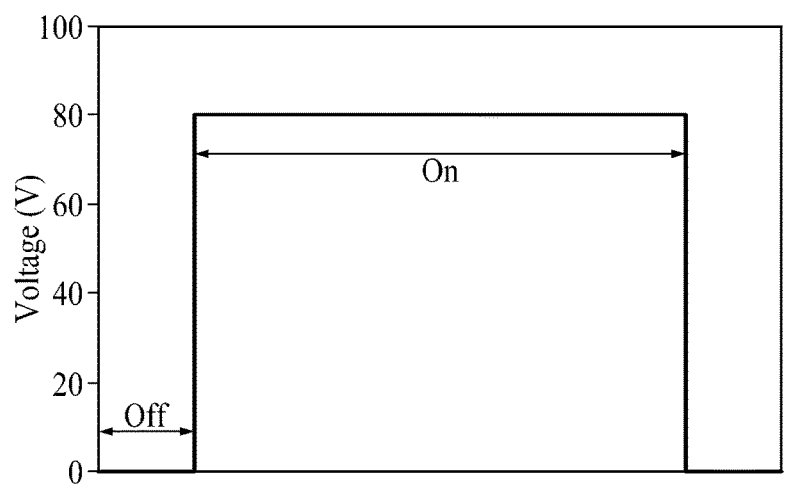
FIGS. 7A and 7B are diagrams showing a driving voltage characteristic for realizing a light blocking device according to an aspect of the present disclosure in a light transmitting mode.
Figure 7B:
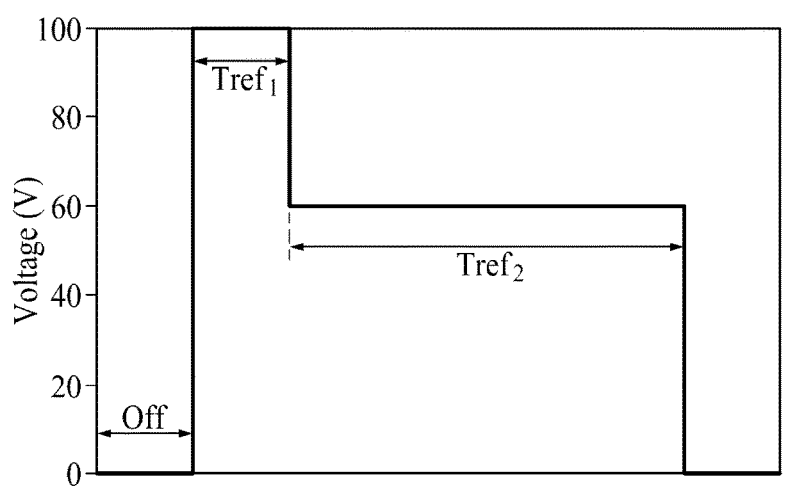

FIGS. 7A and 7B are diagrams showing a driving voltage characteristic for realizing a light blocking device according to an aspect of the present disclosure in a light transmitting mode.

FIG. 7A shows a driving voltage characteristic of a light blocking device according to an aspect of the present disclosure, for implementing the light blocking device an aspect of the present disclosure in the light transmitting mode. FIG. 7B shows a driving voltage characteristic of a light blocking device according to another aspect of the present disclosure, for driving the light blocking device an aspect of the present disclosure in the light transmitting mode. Hereinafter, an example of driving the light blocking device 100 according to an aspect of the present disclosure described above with reference to FIGS. 1 to 5 will be described. However, a below-described driving method may be identically applied to the light blocking devices 200, 300, and 400 according to another aspect of the present disclosure.

As shown in FIG. 7A, in order to drive the light blocking device according to an aspect of the present disclosure in the light transmitting mode, the voltage supply unit 160 may respectively apply voltages to the first electrode 120 and the second electrode 140 so that a voltage difference between a voltage applied to the first electrode 120 and a voltage applied to the second electrode 140 is greater than the second threshold value.

However, as described above, since the liquid crystals 130c and the dichroic dyes 130d are twisted with each other in the PDLC layer 130 of the light blocking device 100 according to an aspect of the present disclosure, the second threshold value may have a value which is higher than a case where the related art light blocking device is driven in the light transmitting mode.

That is, in the related art light blocking device, since the liquid crystals and the dichroic dyes are not twisted, a relatively lower voltage is needed for aligning the liquid crystals and the dichroic dyes in a certain direction. In the light blocking device 100 according to an aspect of the present disclosure, since the liquid crystals 130c and the dichroic dyes 130d are twisted with each other, a relatively higher voltage is needed for releasing the twist structure of the liquid crystals 130c and the dichroic dyes 130d and aligning the liquid crystals 130c and the dichroic dyes 130d in a certain direction. As a result, as the light blocking device 100 is driven in the light transmitting mode, a driving voltage increases, and consumption power increases.

Particularly, since the liquid crystals 130c and the dichroic dyes 130d are twisted with each other, a hysteresis exists in a transmittance and a haze, based on an increase or a reduction in the voltages respectively applied to the first electrode 120 and the second electrode 140.

Therefore, in an aspect of the present disclosure, as shown in FIG. 7B, the voltage supply unit 160 may be over-driven for a certain time, thereby preventing the driving voltage and consumption power from increasing.

In detail, the voltage supply unit 160 may supply a voltage, where a voltage difference between a voltage applied to the first electrode 120 and a voltage applied to the second electrode 140 corresponds to a first reference value, for a first reference time Tref1, and when the first reference time Tref1 elapses, the voltage supply unit 160 may supply a voltage, where the voltage difference between the voltage applied to the first electrode 120 and the voltage applied to the second electrode 140 corresponds to a second reference value less than the first reference value, for a second reference time Tref2. In this case, the first reference time may be set shorter than the second reference time. Accordingly, since the first reference time for which an over voltage is applied is shorter than the second reference time, the light blocking device 100 may be driven without any increase in consumption power.

That is, in an aspect of the present disclosure, as in FIG. 7A, a characteristic of the driving voltage which is applied without any change may be changed, a voltage having the first reference value corresponding to a voltage higher than a previous driving voltage may be supplied for the first reference time, and when the first reference time elapses, a voltage having the second reference value corresponding to a voltage lower than the previous driving voltage may be supplied for the second reference time, thereby reflecting a hysteresis of a transmittance and a haze. Accordingly, the light blocking device 100 including the PDLC layer 130 having a structure where the liquid crystals 130c and the dichroic dyes 130d are twisted may be driven in the light transmitting mode without any increase in the driving voltage or consumption power.

Hereinafter, a method of manufacturing a light blocking device according to an aspect of the present disclosure will be described in detail.

Figure 8:
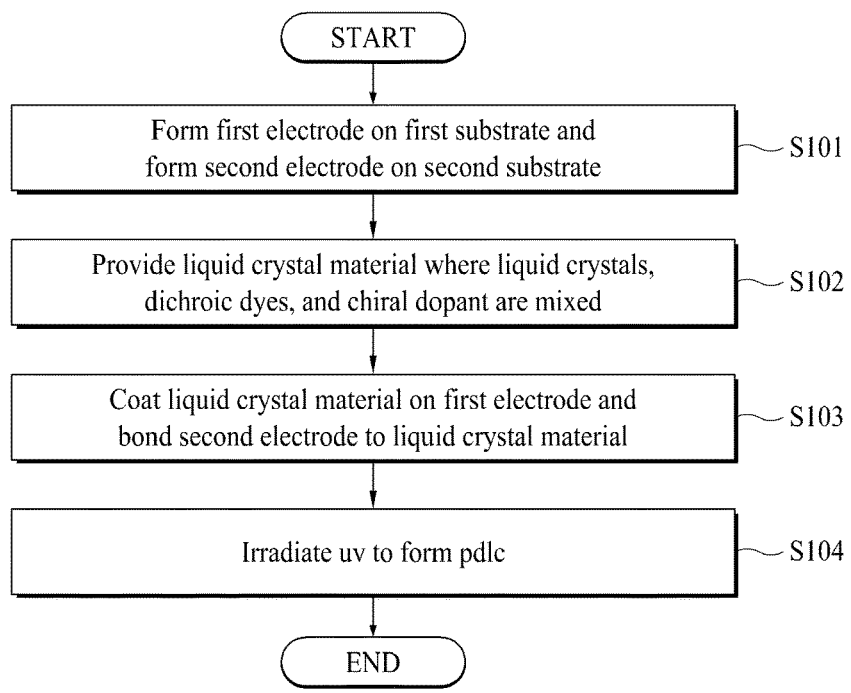
FIG. 8 is a flowchart illustrating a method of manufacturing a light blocking device according to an aspect of the present disclosure.

FIG. 8 is a flowchart illustrating a method of manufacturing a light blocking device according to an aspect of the present disclosure.

First, the first electrode 120 may be formed on the first substrate 110, and the second electrode 140 may be formed on the second substrate 150 in operation S101. The first substrate 110 and the second substrate 150 may each be a transparent glass substrate, a plastic film, or the like. The first substrate 110 and the second substrate 150 may each be a transparent electrode or the like.

Subsequently, in operation S102, a liquid crystal material having a liquid state may be produced by mixing the liquid crystals 130c, the dichroic dyes 130d, and a chiral dopant with a monomer. In addition, the chiral dopant may be added in a case where the liquid crystals 130c and the dichroic dyes 130d are mixed in the monomer, and thus, the liquid crystals 130c and the dichroic dyes 130d may be twisted with each other.

In an aspect of the present disclosure, chiral dopants which enable the liquid crystals 130c and the dichroic dyes 130d to be twisted with each other at an angle of 360 degrees to 3,600 degrees in each of the droplets 130b may be mixed with the monomer along with the liquid crystals 130c and the dichroic dyes 130d. Also, a mixing rate at which the monomer and the liquid crystals 130c are mixed in the liquid crystal material may be set within an appropriate range, based on scattering and absorbing of light. A photo initiator may be added into the liquid crystal material.

Moreover, the dichroic dyes 130d may be mixed with the liquid crystal material at a certain rate. For example, the dichroic dyes 130d may be added by 0.5 wt % to 5 wt % of the liquid crystal material. In order to obtain a light blocking effect based on the dichroic dyes 130d in the light blocking mode, the dichroic dyes 130d may be added by 0.5 wt % or more of the liquid crystal material. Also, when UV is irradiated onto the dichroic dyes 130d, the dichroic dyes 130d may be absorb the UV, and thus, some of monomers included in the liquid crystal material cannot be cured to a polymer. That is, as the amount of the dichroic dyes 130d increases, the amount of monomers remaining in the PDLC layer 130 increases due to absorption of the UV by the dichroic dyes 130d. A non-cured polymer may be left as a polymer and may remain as a floating material in the cell gap between the first substrate 110 and the second substrate 120, and when a voltage is applied, a movement of the PDLC layer 130 is affected. Therefore, a light transmittance of the PDLC layer 130 is lowered in the light transmitting mode due to the remaining monomer. Accordingly, the dichroic dyes 130d may be added by 5 wt % of the liquid crystal material.

Subsequently, the liquid crystal material may be coated on the first electrode 120, and the second electrode 140 of the second substrate 150 may be bonded to the liquid crystal material in operation S103. However, the present aspect is not limited thereto, and the second electrode 140 may be disposed on the liquid crystal material through lamination.

Subsequently, by irradiating UV onto the liquid crystal material, the PDLC layer 130 may be formed in operation S104. A wavelength range of the UV which is irradiated for forming the PDLC layer 130 may be 10 nm to 200 nm, and for example, may be 320 nm to 380 nm. Also, an UV irradiation duration may be 10 sec to 60 min. Here, an intensity of the UV may be 10 mW/cm$^2$ to 50 mW/cm$^2$, and for example, may be 10 mW/cm$^2$ to 20 mW/cm$^2$.

Operations S103 and S104 of FIG. 8 according to an aspect of the present disclosure may be performed in a roll-to-roll method. That is, the first substrate 110 including the first electrode 120 may be moved by rollers, and a liquid crystal injecting device may coat the liquid crystal material on the first electrode 120.

Moreover, the first substrate 110 including the liquid crystal material may be moved by the rollers and may be bonded to the second substrate 150 including the second electrode 140. At this time, after the first substrate 110 is bonded to the second substrate 150, an UV irradiating device may irradiate the UV to cure the liquid crystal material, thereby forming the PDLC layer 130. UV energy irradiated for forming the PDLC layer 130 is as described above.

Subsequently, by cutting the bonded first and second substrates 110 and 150, the light blocking device 100 may be manufactured.

As described above, the light blocking device 100 illustrated in FIG. 2 may be finished in the manufacturing method according to an aspect of the present disclosure illustrated in FIG. 8. Also, the light blocking devices 200, 300, and 400 according to another aspect of the present disclosure illustrated in FIGS. 6A to 6C may be manufactured in the manufacturing method according to an aspect of the present disclosure illustrated in FIG. 8.

Moreover, in an aspect of the present disclosure, instead of a method of injecting a liquid crystal into a gap between the first substrate 110 and the second substrate 150, a method of coating the liquid crystal material on the first substrate 110 or the second substrate 150 and curing the liquid crystal material with UV may be used. Accordingly, according to an aspect of the present disclosure, a manufacturing process is simplified, and the cost is reduced.

Hereinafter, a transparent display device according to an aspect of the present disclosure including the light blocking device according to an aspect of the present disclosure will be described in detail.

Figure 9:
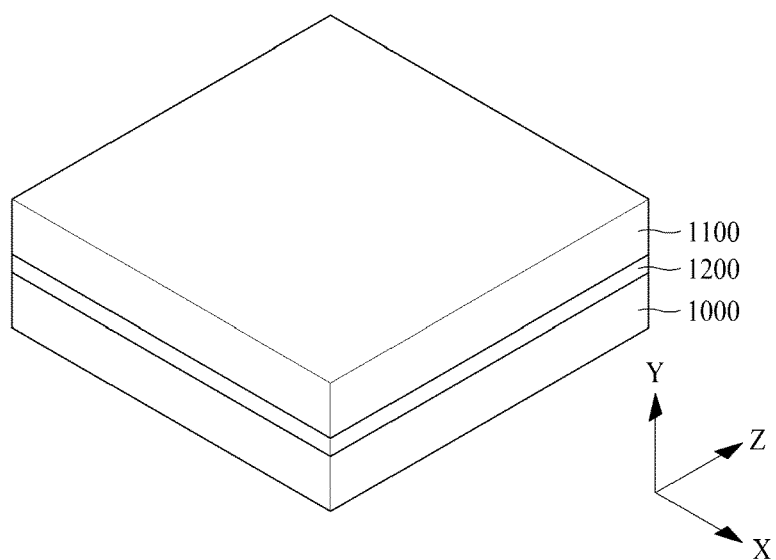
FIG. 9 is a perspective view illustrating a transparent display device according to an aspect of the present disclosure.

FIG. 9 is a perspective view illustrating a transparent display device according to an aspect of the present disclosure.

Figure 10:
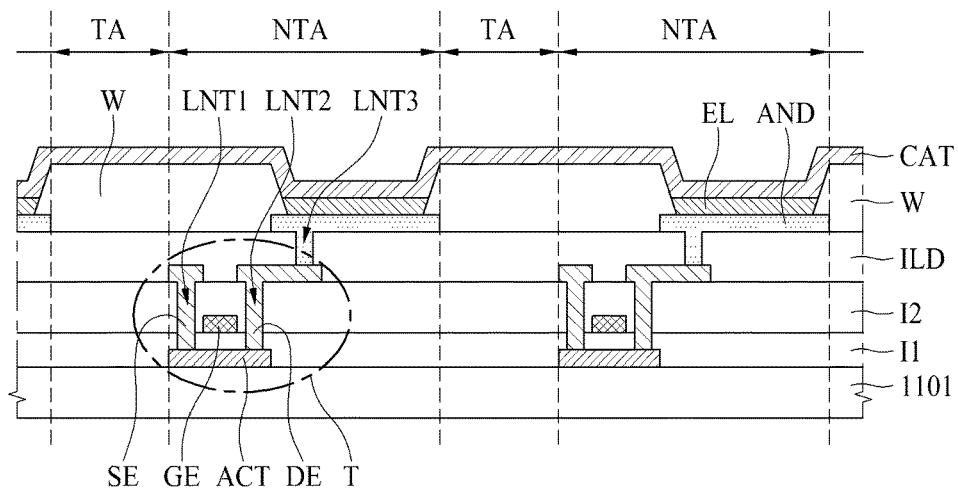
FIG. 10 is a cross-sectional view illustrating in detail a lower substrate of a transparent display panel of FIG. 9.

FIG. 10 is a cross-sectional view illustrating in detail a lower substrate of a transparent display panel of FIG. 9.

Referring to FIG. 9, the transparent display device may include a light blocking device 1000, a transparent display panel 1100, and an adhesive layer 1200.

The light blocking device 1000 may be implemented as one of the light blocking devices 200, 300, and 400 according to another aspect of the present disclosure illustrated in FIGS. 6A to 6C. Therefore, the light blocking device 1000 may block incident light in the light blocking mode, and in the light transmitting mode, the light blocking device 1000 may transmit the incident light. Particularly, the light blocking device 1000 according to an aspect of the present disclosure may include a PDLC layer including liquid crystals and dichroic dyes which are twisted with each other, and thus, may have an enhanced light blocking rate in the light blocking mode. Also, the light blocking device 1000 may display a specific color by using the dichroic dyes, and thus, a rear scene of the light blocking device 1000 is not shown, thereby enabling a user to feel an aesthetic sense in addition to a light blocking function.

The transparent display panel 1100 may include a transmissive area TA and a non-transmissive area NTA as in FIG. 10. A plurality of pixels displaying an image may be provided in the non-transmissive area NTA. Each of the plurality of pixels, as in FIG. 10, may include a transistor T, an anode electrode AND, an organic layer EL, and a cathode electrode CAT.

The transistor T may include an active layer ACT provided on a lower substrate 1101, a first insulation layer I1 provided on the active layer ACT, a gate electrode GE provided on the first insulation layer I1, a second insulation layer I2 provided on the gate electrode GE, and a source electrode SE and a drain electrode DE which are provided on the second insulation layer I2 and are connected to the active layer ACT through first and second contact holes CNT1 and CNT2. In FIG. 10, the transistor T is illustrated as being formed as a top gate type, but may be formed as a bottom gate type without being limited thereto.

The anode electrode AND may be connected to the drain electrode DE of the transistor T through a third contact hole CNT3 passing through an interlayer dielectric ILD which is provided on the source electrode SE and the drain electrode DE. Accordingly, a partition wall W may be provided between adjacent anode electrodes AND to electrically insulate the adjacent anode electrodes AND.

The organic layer EL may be provided on the anode electrode AND. The organic layer EL may include a hole transporting layer, an organic light emitting layer, and an electron transporting layer.

The cathode electrode CAT may be provided on the organic layer EL and the partition wall W. When a voltage is applied to the cathode electrode CAT and the anode electrode AND, a hole and an electron may move to the organic light emitting layer through the hole transporting layer and the electron transporting layer and are combined in the organic light emitting layer to emit light.

In FIG. 10, the transparent display panel 1100 is illustrated as being implemented as a top emission type, but is not limited thereto. Alternatively, the transparent display panel 1100 may be implemented as a bottom emission type or a dual emission type. When the transparent display panel 1100 is implemented as the top emission type, the light blocking device 1000 may be disposed under the lower substrate 1101. When the transparent display panel 1100 is implemented as the bottom emission type, the light blocking device 1000 may be disposed on an upper substrate.

The transparent display panel 1100 may be adhered to the light blocking device 1000 by the adhesive layer 1200. The adhesive layer 1200 may be a transparent adhesive film such as an OCA or the like. One surface of the adhesive layer 1200 may be adhered to a portion under the lower substrate 1101 of the transparent display panel 1100 or a portion on the upper substrate, and another surface of the adhesive layer 1200 may be adhered to the light blocking device 1000. When the adhesive layer 1200 is implemented as the transparent adhesive film such as the OCA or the like, the adhesive layer 1200 may have a refractive index of 1.4 to 1.9.

Moreover, the lower substrate 1101 or the upper substrate of the transparent display panel 1100 may be a second substrate of the light blocking device 1000. In this case, the second electrode 140 of the light blocking device 1000 may be provided on the lower substrate 1101 or the upper substrate of the transparent display panel 1100.

The transparent display panel 1100 may be driven in a display mode, where the pixels display an image, and a non-display mode where the pixels do not display an image. When the transparent display panel 1100 is driven in the display mode where the pixels display an image, the light blocking device 1000 may be driven in the light blocking mode where incident light is blocked through a rear surface of the transparent display panel 1100, for increasing the quality of an image.

In the non-display mode where the pixels do not display an image, the light blocking device 1000 may be driven in the light blocking mode or the light transmitting mode. When the light blocking device 1000 is driven in the light blocking mode in the non-display mode where the pixels do not display an image, the transparent display device is shown in black to a user. When the light blocking device 1000 is driven in the light transmitting mode in the non-display mode where the pixels do not display an image, the transparent display device may be transparently implemented, and thus, the user can see a rear scene of the transparent display device through the transparent display device.

Figure 11:
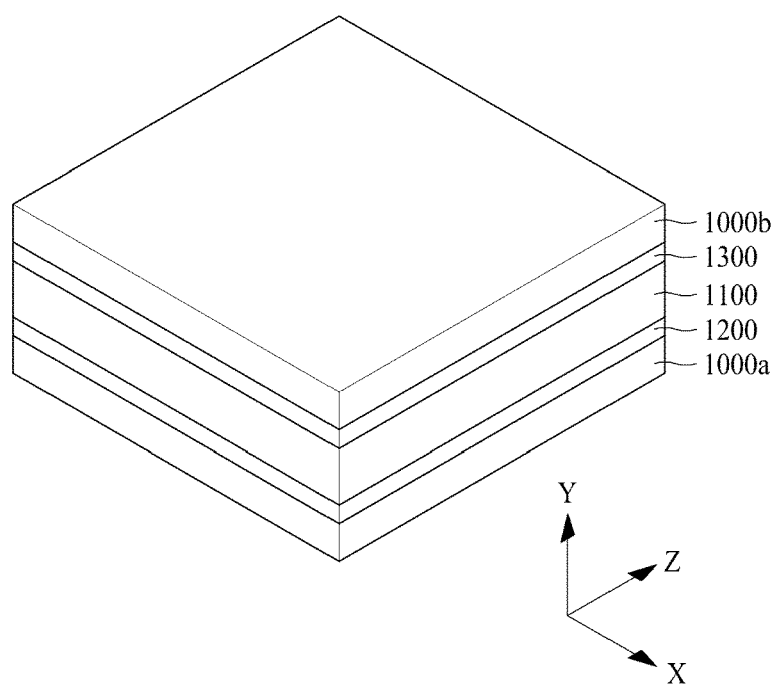
FIG. 11 is a perspective view of a transparent display device according to another aspect of the present disclosure.

FIG. 11 is a perspective view of a transparent display device according to another aspect of the present disclosure.

Referring to FIG. 11, the transparent display device may include a first light blocking device 1000a, a second light blocking device 1000b, a transparent display panel 1100, a first adhesive layer 1200, and a second adhesive layer 1300.

Each of the first and second light blocking devices 1000a and 1000b may be implemented as one of the light blocking devices 100, 200, 300, and 400 according to the aspects of the present disclosure described above with reference to FIGS. 1, 2, and 6A to 6C. Therefore, each of the first and second light blocking devices 1000a and 1000b may block incident light in the light blocking mode, and in the light transmitting mode, each of the first and second light blocking devices 1000a and 1000b may transmit the incident light. Each of the first and second light blocking devices 1000a and 1000b enables a user to feel an aesthetic sense in addition to a light blocking function, based on dichroic dyes.

The transparent display panel 1100 is substantially the same as described above with reference to FIGS. 9 and 10. Thus, a detailed description of the transparent display panel 1100 is omitted.

The transparent display panel 1100 may be adhered to the first light blocking device 1000a by the first adhesive layer 1200. The first adhesive layer 1200 may be a transparent adhesive film such as an OCA or the like. One surface of the first adhesive layer 1200 may be adhered to a portion under the lower substrate 1101 of the transparent display panel 1100 or a portion on the upper substrate, and another surface of the first adhesive layer 1200 may be adhered to the first light blocking device 1000a. When the first adhesive layer 1200 is implemented as the transparent adhesive film such as the OCA or the like, the first adhesive layer 1200 may have a refractive index of 1.4 to 1.9.

The transparent display panel 1100 may be adhered to the second light blocking device 1000b by the second adhesive layer 1300. The second adhesive layer 1300 may be a transparent adhesive film such as an OCA or the like. One surface of the second adhesive layer 1300 may be adhered to a portion under the lower substrate 1101 of the transparent display panel 1100 or a portion on the upper substrate, and another surface of the second adhesive layer 1300 may be adhered to the second light blocking device 1000b. When the second adhesive layer 1300 is implemented as the transparent adhesive film such as the OCA or the like, the second adhesive layer 1300 may have a refractive index of 1.4 to 1.9.

The transparent display panel 1100 may be driven in the display mode, where the pixels display an image, and the non-display mode where the pixels do not display an image. In a case where it is assumed that a user watches an image through the second light blocking device 1000b, when the transparent display panel 1100 is driven in the display mode where the pixels display an image, the first light blocking device 1000a may be driven in the light blocking mode where incident light is blocked through a rear surface of the transparent display panel 1100, for increasing the quality of an image.

In the non-display mode where the pixels do not display an image, the first and second light blocking devices 1000a and 1000b may be driven in the light blocking mode or the light transmitting mode. When the first and second light blocking devices 1000a and 1000b are driven in the light blocking mode in the non-display mode where the pixels do not display an image, the transparent display device is shown in black to a user. When the first and second light blocking devices 1000a and 1000b are driven in the light transmitting mode in the non-display mode where the pixels do not display an image, the transparent display device may be transparently implemented, and thus, the user can see a rear scene of the transparent display device through the transparent display device.

The transparent display panel 1100 may be implemented as a double-sided transparent display panel for displaying an image in a double-sided direction. When the first and second light blocking devices 1000a and 1000b are driven in the light transmitting mode in the display mode where the double-sided transparent display panel displays an image in the double-sided direction, users can watch an image in the double-sided direction. Also, when one of the first and second light blocking devices 1000a and 1000b is driven in the light blocking mode in the display mode where the double-sided transparent display panel displays an image in the double-sided direction, users cannot watch an image in one direction of the double-sided direction.

As described above, according to the aspects of the present disclosure, since the light blocking device includes the PDLC layer where liquid crystals and dichroic dyes are twisted with each other in a droplet, a light blocking rate increases in the light blocking mode, and a light transmittance increases in the light transmitting mode.

Moreover, according to the aspects of the present disclosure, the PDLC layer may be over-driven by reflecting a hysteresis of a light blocking rate and a light transmittance of liquid crystals and dichroic dyes twisted with each other, thereby preventing a driving voltage from increasing.

Moreover, according to the aspects of the present disclosure, by controlling a twisted angle at which liquid crystals and dichroic dyes are twisted with each other, a light blocking rate increases in the light blocking mode.

Moreover, according to the aspects of the present disclosure, since portions of a plurality of PDLC layers except droplets are in a solid state due to a polymer, a cell gap is maintained even without a spacer or a partition wall. Accordingly, a manufacturing process is simplified, and the manufacturing cost is reduced.

Moreover, according to the aspects of the present disclosure, instead of a method of injecting a liquid crystal into a gap between the first substrate and the second substrate, a method of forming a liquid crystal material on a substrate to cure the liquid crystal material with UV may be used, and thus, a manufacturing process is simplified, thereby reducing the cost.

Moreover, according to the aspects of the present disclosure, when the light blocking device executes the light blocking mode of blocking light incident on a rear surface of the transparent display panel in the display mode where the pixels of the transparent display panel display an image, the quality of an image displayed by the transparent display panel is enhanced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light blocking device comprising:
   a first substrate and a second substrate facing each other;
   a first electrode on the first substrate;
   a second electrode on the second substrate;
   a polymer dispersed liquid crystal (PDLC) layer between the first electrode and the second electrode and including liquid crystals and dichroic dyes formed as a droplet, wherein the liquid crystals and the dichroic dyes twisted with each other; and
   a chiral dopant in the PDLC layer that induces twisting between the liquid crystals and the dichroic dyes to form a twisted angle between 360 degrees and 3,600 degrees.

2. The light blocking device of claim 1, wherein the PDLC layer is driven in a light blocking mode of blocking incident light when a voltage is not applied to the first electrode and the second electrode, or a voltage difference between a voltage applied to the first electrode and a voltage applied to the second electrode is less than a first threshold value.

3. The light blocking device of claim 1, wherein the PDLC layer is driven in a light transmitting mode of transmitting incident light when a voltage difference between a voltage applied to the first electrode and a voltage applied to the second electrode is greater than a second threshold value.

4. The light blocking device of claim 1, further comprising at least one of a first refractive index correction layer on a surface opposite to a surface of the first substrate on which the first electrode is disposed, and a second refractive index correction layer on a surface opposite to a surface of the second substrate on which the second electrode is disposed.

5. The light blocking device of claim 4, wherein the first refractive index correction layer has a first refractive index between a refractive index of the first substrate and a refractive index of air, and the second refractive index correction layer has a second refractive index between a refractive index of the second substrate and the refractive index of the air.

6. The light blocking device of claim 1, further comprising at least one of a first refractive index correction layer between the first substrate and the first electrode, and a second refractive index correction layer between the second substrate and the second electrode.

7. The light blocking device of claim 6, wherein the first refractive index correction layer has a first refractive index between a refractive index of the first substrate and a refractive index of air, and the second refractive index correction layer has a second refractive index between a refractive index of the second substrate and the refractive index of the air.

8. The light blocking device of claim 1, further comprising at least one of a first refractive index correction layer between the first electrode and the PDLC layer, and a second refractive index correction layer between the second electrode and the PDLC layer.

9. The light blocking device of claim 8, wherein the first refractive index correction layer has a first refractive index between a refractive index of the first substrate and a refractive index of air, and the second refractive index correction layer has a second refractive index between a refractive index of the second substrate and the refractive index of the air.

10. The light blocking device of claim 1, further comprising a voltage supply unit supplying a voltage to at least one of the first electrode and the second electrode.

11. The light blocking device of claim 10, wherein the voltage supply unit supplies a voltage during a first reference time when the PDLC layer is driven in a light transmitting mode, where a voltage difference between the voltage applied to the first electrode and the voltage applied to the second electrode corresponds to a first reference value.

12. The light blocking device of claim 11, wherein the voltage supply unit supplies a voltage supplies a voltage during a second reference time, where the voltage difference between the voltage applied to the first electrode and the voltage applied to the second electrode corresponds to a second reference value less than the first reference value.

13. The light blocking device of claim 12, wherein the first reference time is shorter than the second reference time.

14. The light blocking device of claim 12, wherein the first reference value is an over- driven value with respect to the second reference value to prevent increase in a driving voltage and a power consumption of the device.

15. A transparent display device comprising:
a transparent display panel including a transmissive area, a non-transmissive area, and a plurality of pixels provided in the non-transmissive area to display an image; and
a light blocking device on at least one surface of the transparent display panel,
wherein the light blocking device comprises a polymer dispersed liquid crystal (PDLC) layer driven in a light blocking mode of blocking incident light or a light transmitting mode of transmitting the incident light, based on a voltage supplied thereto, and the PDLC layer comprises liquid crystals and dichroic dyes formed as a droplet, wherein the liquid crystals and the dichroic dyes are twisted with each other, and a chiral dopant in the PDLC layer that induces twisting between the liquid crystals and the dichroic dyes to form a twisted angle between 360 degrees and 3,600 degrees.

16. A method of manufacturing a light blocking device, the method comprising:
forming a first electrode on the first substrate and a second electrode on the second substrate, respectively;
forming a liquid crystal material, where liquid crystals, dichroic dyes, and a chiral dopant are mixed with a monomer, on the first electrode and bonding the second electrode to the liquid crystal material, and
irradiating ultraviolet (UV) to form a polymer dispersed liquid crystal (PDLC) layer,
wherein the PDLC layer includes liquid crystals and dichroic dyes formed as a droplet, the liquid crystals and the dichroic dyes are twisted with each other, and the chiral dopant in the PDLC layer that induces twisting between the liquid crystals and the dichroic dyes to form a twisted angle between 360 degrees and 3,600 degrees.

17. The method of claim 16, wherein the dichroic dyes are added by 0.5 wt % to 5 wt % of the liquid crystal material.

18. The method of claim 16, wherein the ultraviolet irradiated with an intensity of 10 to 50 mW/cm$^2$.

* * * * *